United States Patent
Huang

(10) Patent No.: US 8,429,808 B2
(45) Date of Patent: Apr. 30, 2013

(54) METHOD FOR FABRICATION AN ELECTRICAL TRANSDUCER

(75) Inventor: Yongli Huang, San Jose, CA (US)

(73) Assignee: Kolo Technologies, Inc., San Jose, CA (US)

( * ) Notice: Subject to any disclaimer, the term of this patent is extended or adjusted under 35 U.S.C. 154(b) by 181 days.

(21) Appl. No.: 12/745,727

(22) PCT Filed: Dec. 3, 2008

(86) PCT No.: PCT/US2008/085374
§ 371 (c)(1),
(2), (4) Date: Jun. 2, 2010

(87) PCT Pub. No.: WO2009/073706
PCT Pub. Date: Jun. 11, 2009

(65) Prior Publication Data
US 2010/0251537 A1    Oct. 7, 2010

Related U.S. Application Data

(60) Provisional application No. 60/992,052, filed on Dec. 3, 2007.

(51) Int. Cl.
*H04R 31/00* (2006.01)

(52) U.S. Cl.
USPC ............ 29/594; 29/417; 29/592.1; 29/595; 29/609.1; 73/504.04; 73/504.12; 73/504.14; 73/504.16; 310/331; 310/332; 310/340; 310/344; 310/345; 438/462; 438/463; 438/707

(58) Field of Classification Search ........ 29/417, 29/592.1, 594, 595, 609.1, 831, 846; 73/504.04, 73/504.12–504.16; 310/330–332, 340, 344, 310/345; 438/462, 463, 707
See application file for complete search history.

(56) References Cited

U.S. PATENT DOCUMENTS

| 5,353,498 | A  |   | 10/1994 | Fillion et al. |
| 5,841,193 | A  |   | 11/1998 | Eichelberger |
| 6,472,290 | B2 |   | 10/2002 | Cho et al. |
| 7,049,051 | B2 |   | 5/2006  | Gabriel et al. |
| 7,134,942 | B2 | * | 11/2006 | Nagai et al. ............. 451/41 |
| 7,473,866 | B2 | * | 1/2009  | Morishige et al. ...... 219/121.76 |
| 7,544,588 | B2 | * | 6/2009  | Genda .................... 438/462 |
| 2005/0146240 | A1 |   | 7/2005 | Smith et al. |
| 2005/0177045 | A1 |   | 8/2005 | Degertekin et al. |
| 2006/0075818 | A1 |   | 4/2006 | Huang et al. |

(Continued)

FOREIGN PATENT DOCUMENTS

| EP | 1810619 A1 | 7/2007 |
| JP | 2004004342 A  * | 1/2004 |

(Continued)

OTHER PUBLICATIONS

Translated Chinese Office Action mailed Apr. 6, 2012 for Chinese patent application No. 200880118678.2, a counterpart foreign application of U.S. Appl. No. 12/745,731, 13 pages.

(Continued)

*Primary Examiner* — Paul D Kim
(74) *Attorney, Agent, or Firm* — Lee & Hayes, PLLC

(57) ABSTRACT

A method for fabricating electrostatic transducers and arrays electrically separates the substrate segments of the transducer elements from each other using a technique involving two cutting steps, in which the first step forms a patterned opening in the substrate to make a partial separation of substrate segments, and the second step completes the separation after the substrate segments have been secured to prevent instability of the substrate segments upon completion of the second step. The securing of the substrate segments may be accomplished by filling a nonconductive material in the partial separation or securing the transducer array on a support substrate. When the substrate is conductive, the separated substrate segments serve as separate bottom electrodes that can be individually addressed. The method is especially useful for fabricating ID transducer arrays.

29 Claims, 9 Drawing Sheets

(Cross-sectional of AA')

(Cross-sectional of BB')

U.S. PATENT DOCUMENTS

2007/0013269 A1     1/2007    Huang
2007/0180916 A1     8/2007    Tian et al.
2007/0273013 A1    11/2007    Kohl et al.

FOREIGN PATENT DOCUMENTS

JP            2007122188       5/2007
JP            2007124613       5/2007
WO    WO2007107736 A2   9/2007

OTHER PUBLICATIONS

Non-Final Office Action for U.S. Appl. No. 12/745,731, mailed on Mar. 29, 2012, Yongli Huang, "Packaging and Connecting Electrostatic Transducer Arrays", 15 pages.

Translated Chinese Office Action mailed Oct. 25, 2011 for Chinese patent application No. 200880118644.3, a counterpart foreign application of U.S. Appl. No. 12/745,727, 10 pages.

Final Office Action for U.S. Appl. No. 12/745,731, mailed on Nov. 9, 2012, Yongli Huang, "Packaging and Connecting Electrostatic Transducer Arrays", 17 pages.

Chinese Office Action mailed Decembe 28, 2012 for Chinese patent application No. 200880118678.2, a counterpart foreign application of U.S. Appl. No. 12/745,731, 11 pages.

Japanese Office Action mailed Dec. 7, 2012 for Japanese patent application No. 2010-536237, a counterpart foreign application of U.S. Appl. No. 12/745,727, 5 pages.

\* cited by examiner

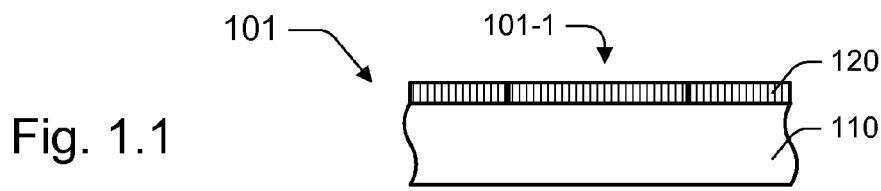
Fig. 1.1
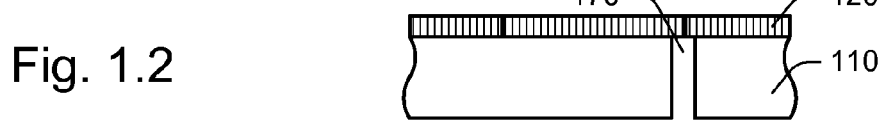
Fig. 1.2
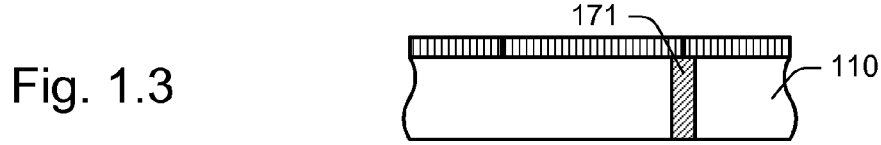
Fig. 1.3
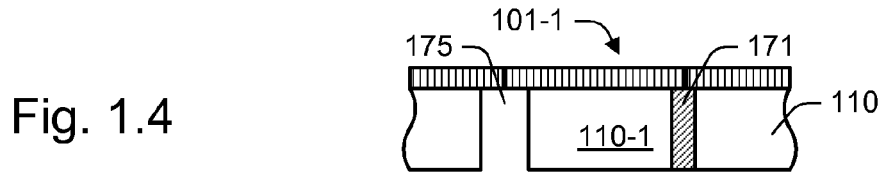
Fig. 1.4
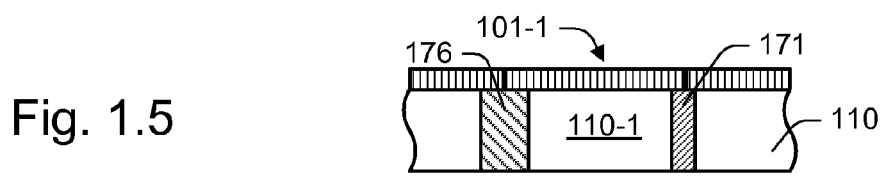
Fig. 1.5
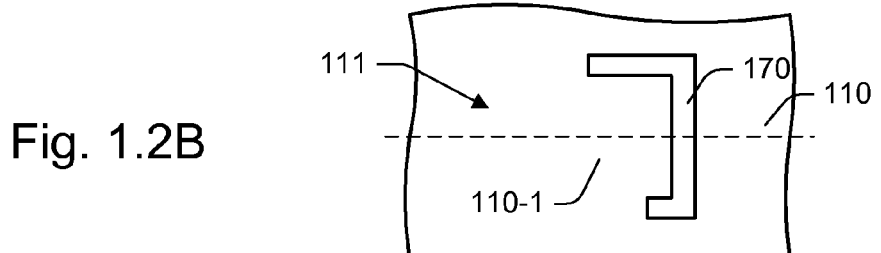
Fig. 1.2B
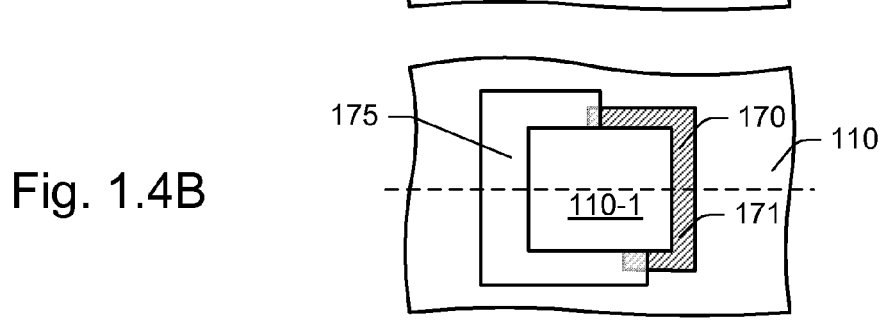
Fig. 1.4B
Fig. 1

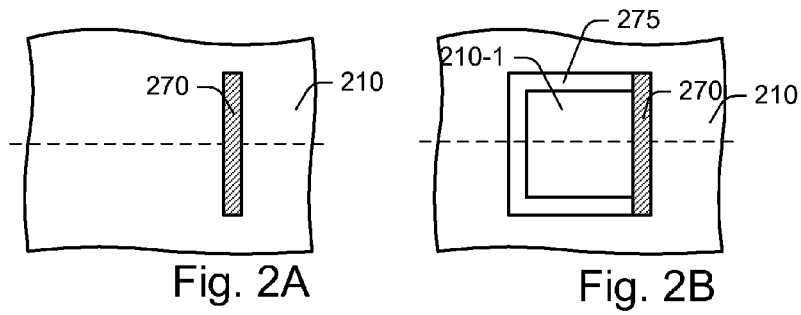
Fig. 2
Fig. 2A  Fig. 2B
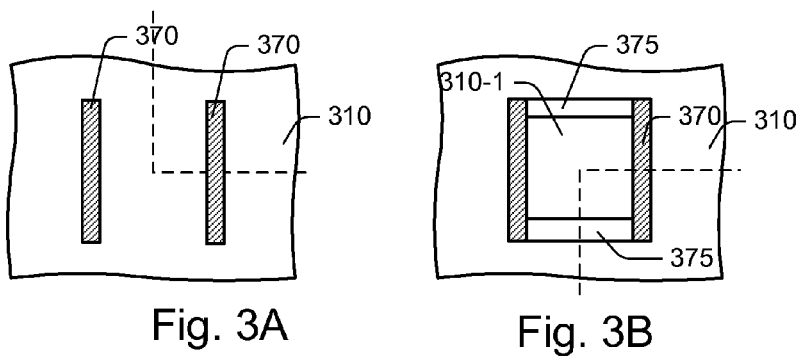
Fig. 3
Fig. 3A  Fig. 3B
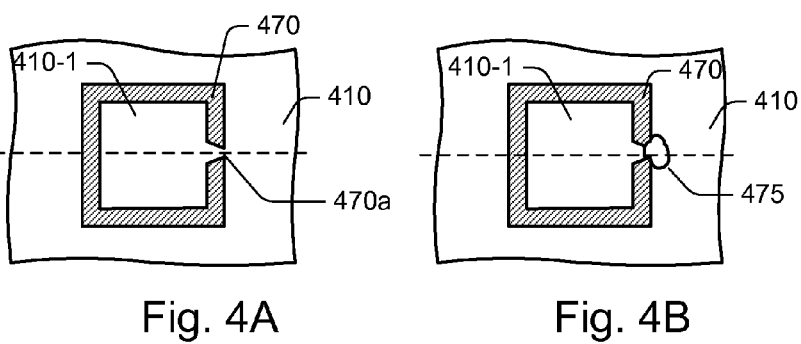
Fig. 4
Fig. 4A  Fig. 4B

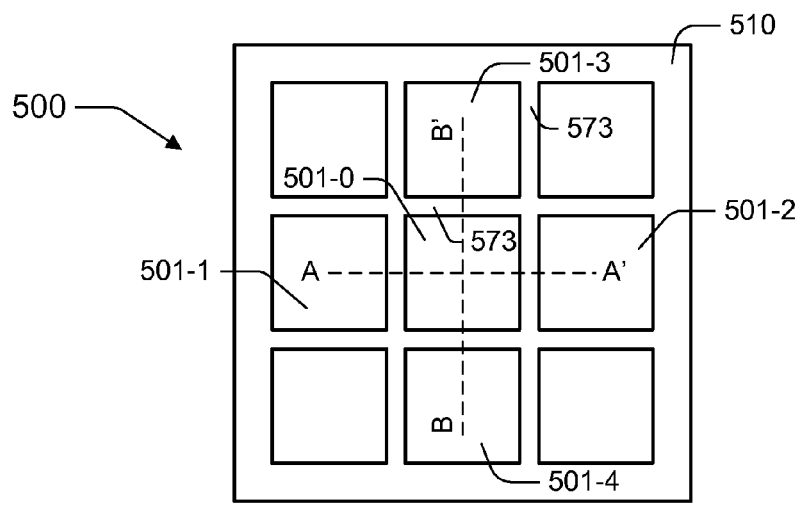
Fig. 5.1 (Top View)
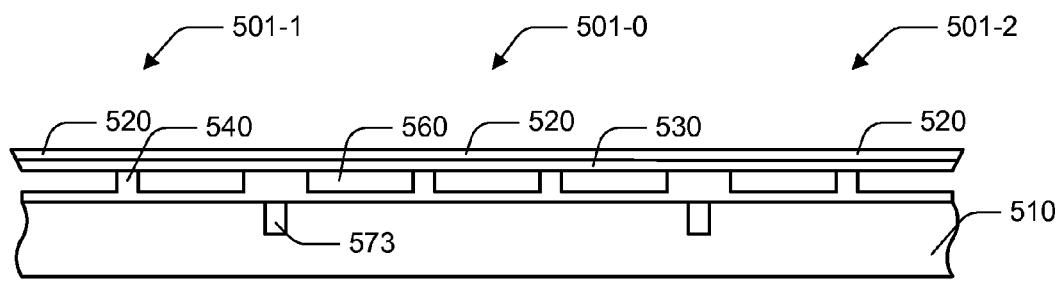
Fig. 5.1A (Cross-sectional of AA')
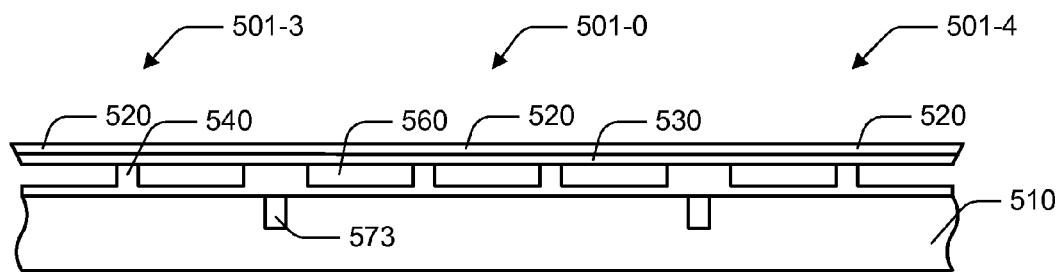
Fig. 5.1B (Cross-sectional of BB')
Fig. 5

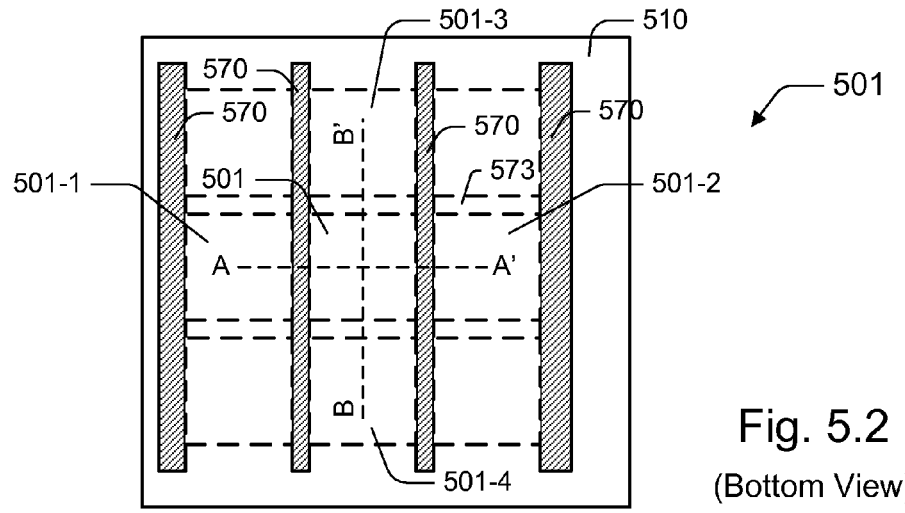
Fig. 5.2 (Bottom View)
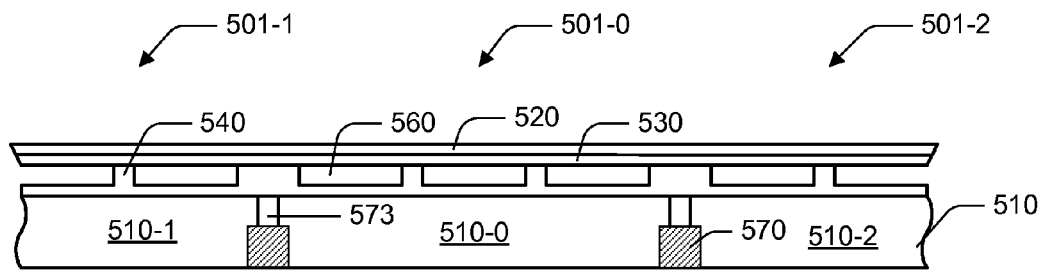
Fig. 5.2A (Cross-sectional of AA')
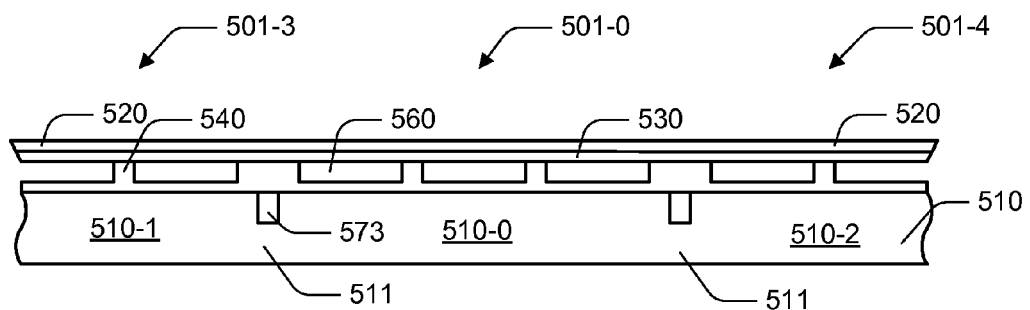
Fig. 5.2B (Cross-sectional of BB')
Fig. 5

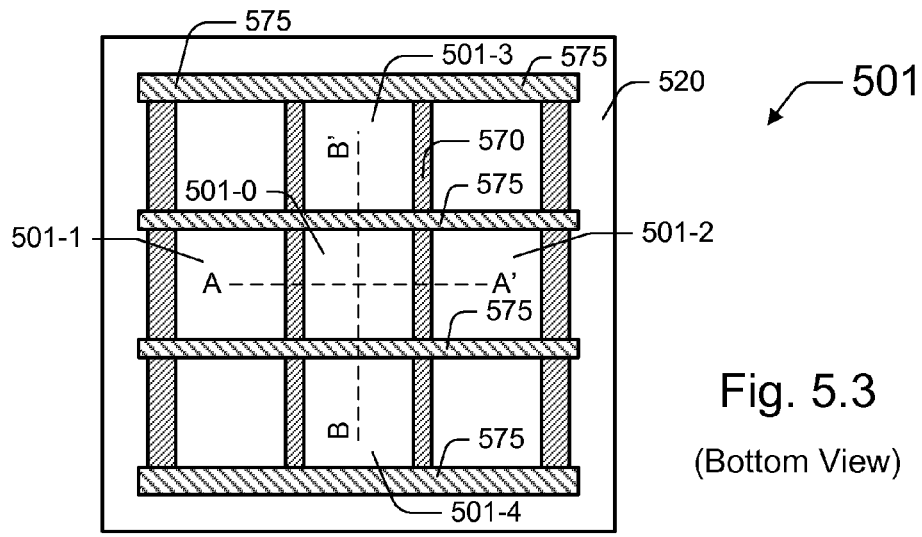
Fig. 5.3 (Bottom View)
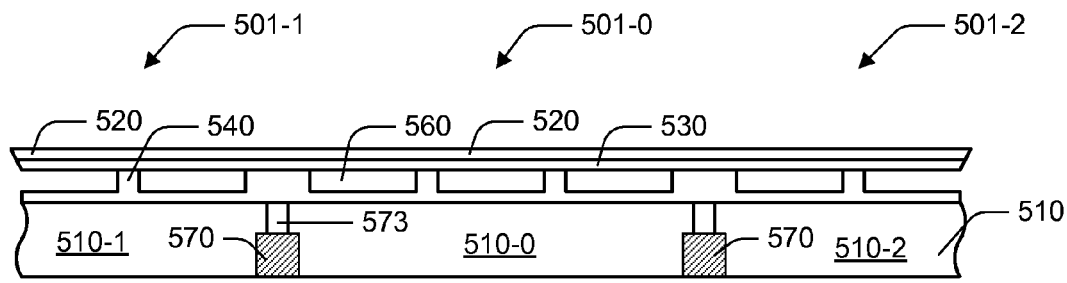
Fig. 5.3A (Cross-sectional view of AA' direction)
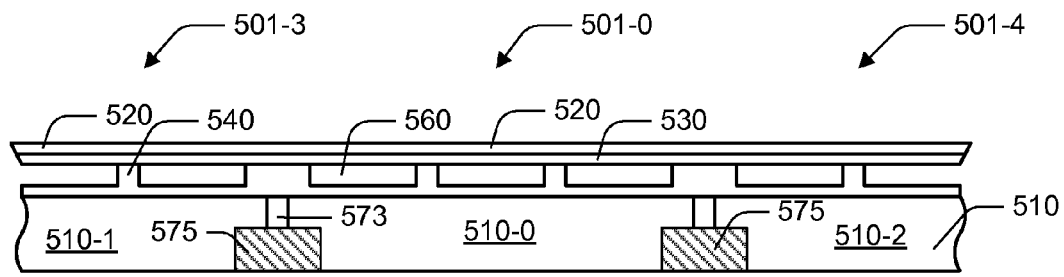
Fig. 5.3B (Cross-sectional view in BB' direction)
Fig. 5

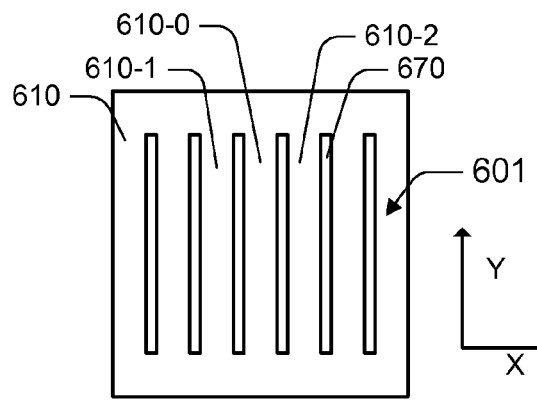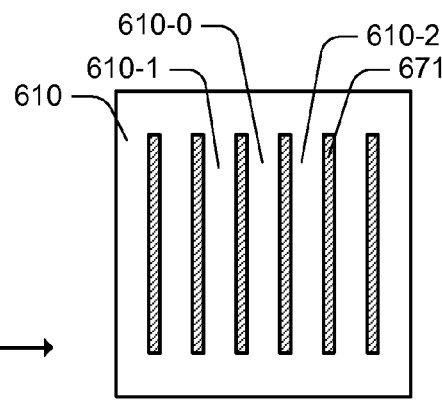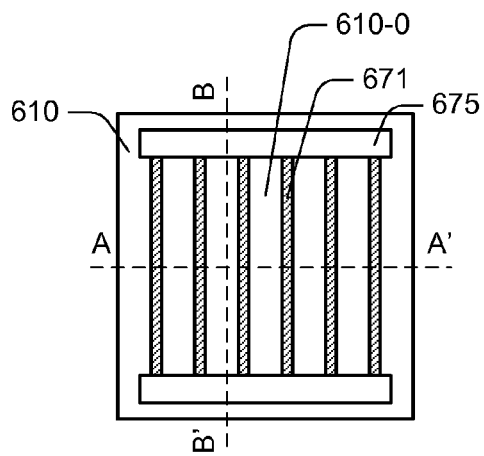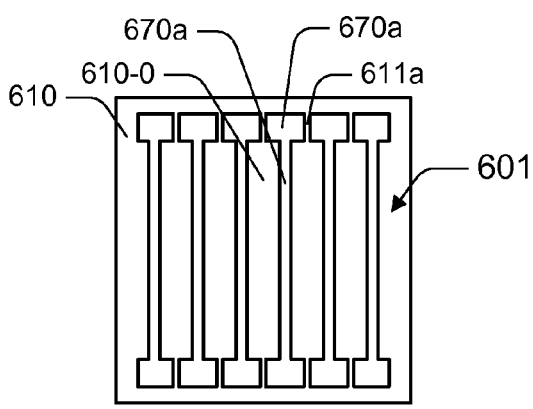
Fig. 6.1 Fig. 6.2 Fig. 6.3 Fig. 6.1A
Fig. 6

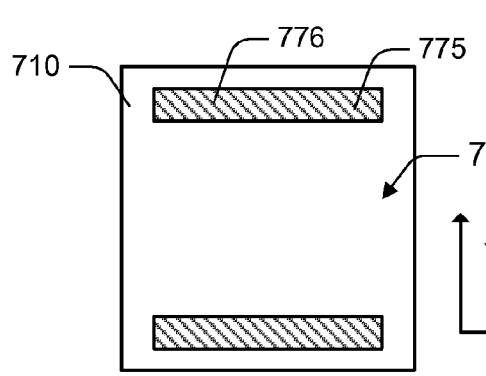
Fig. 7.1
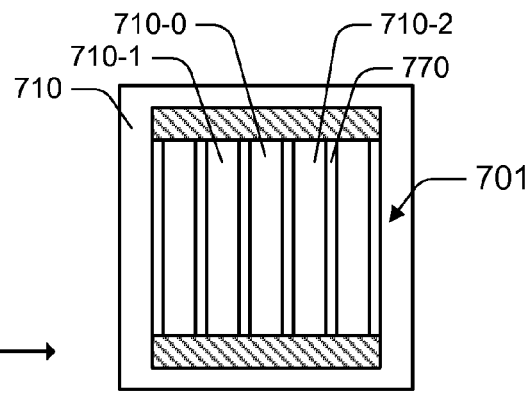
Fig. 7.2
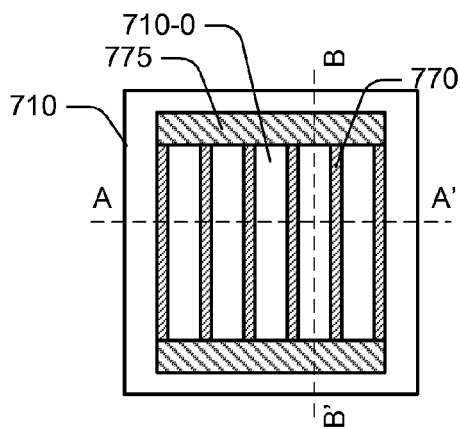
Fig. 7.3
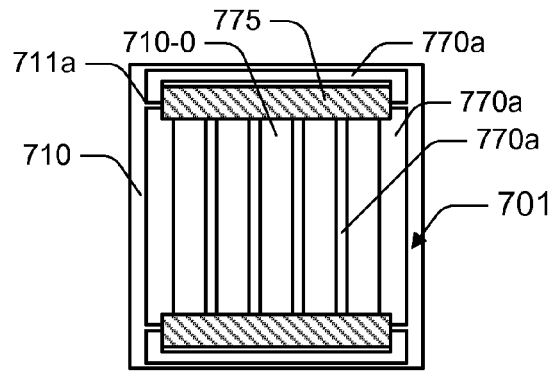
Fig. 7.2A
Fig. 7

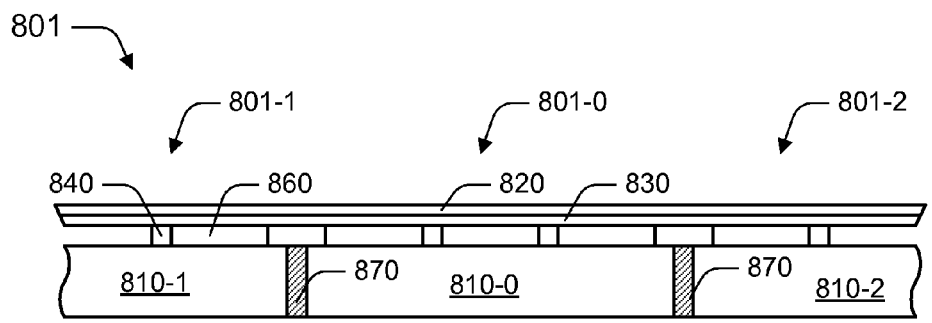
Fig. 8 (Cross-sectional of AA' in Figs. 6-7)
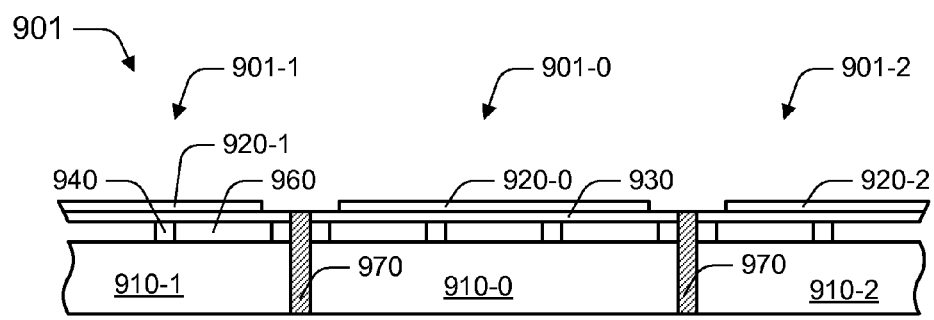
Fig. 9 (Cross-sectional of AA' in Figs. 6-7)
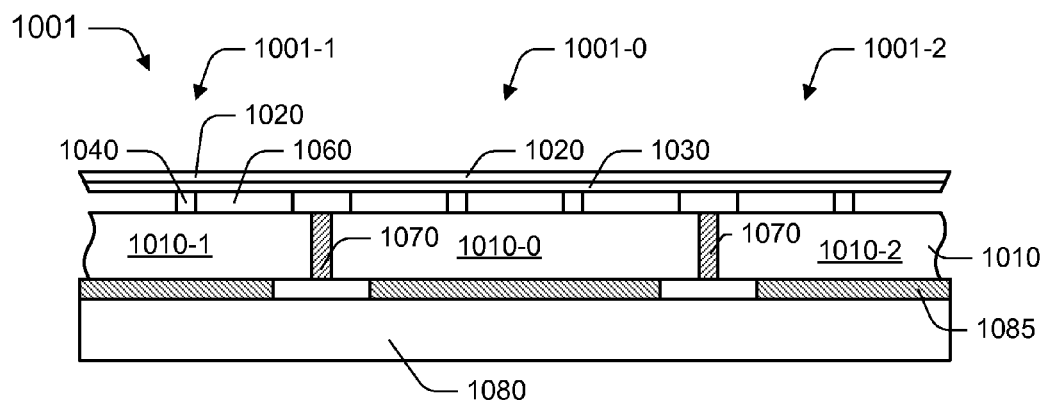
Fig. 10 (Cross-sectional of AA' in Figs. 6-7)

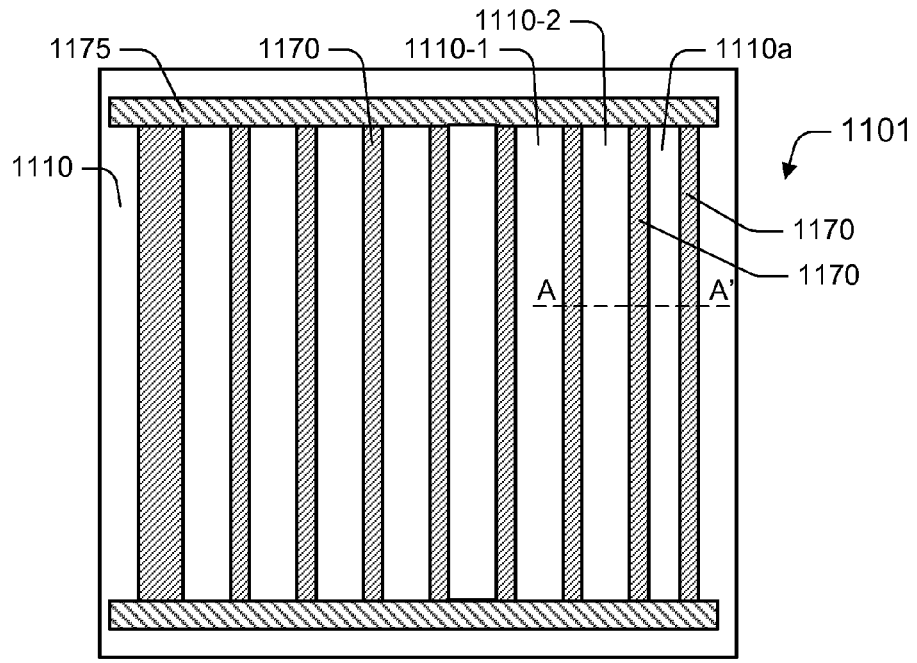
FIG. 11A (Bottom View)
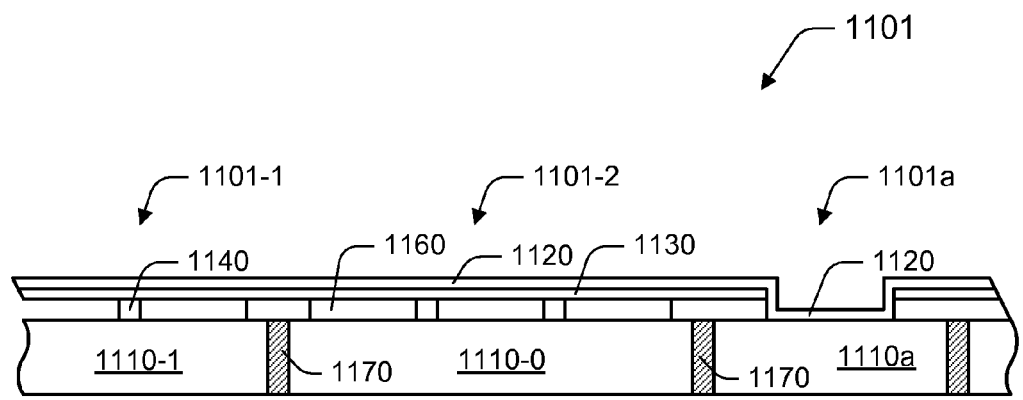
Fig. 11B
(Cross-sectional view in AA' direction of Fig. 11A)

METHOD FOR FABRICATION AN ELECTRICAL TRANSDUCER

RELATED APPLICATIONS

This application claims priority benefits of U.S. Provisional Patent Application No. 60/992,052, entitled "PACKAGING AND CONNECTING ELECTROSTATIC TRANSDUCER ARRAYS", filed on Dec. 3, 2007.

This application is further related to International (PCT) Patent Application No. PCT/US 08/85447, entitled "CMUT PACKAGING FOR ULTRASOUND SYSTEM"; and International (PCT) Patent Application No. PCT/US 08/85352, entitled "PACKAGING AND CONNECTING ELECTROSTATIC TRANSDUCER ARRAYS"; both filed on even date with the present application, which PCT applications are hereby incorporated by reference in their entirety.

This application is further related to International (PCT) Patent Application No. PCT/IB2006/051566, entitled "THROUGH-WAFER INTERCONNECTION", filed on May 18, 2006, which PCT application is hereby incorporated by reference in its entirety.

BACKGROUND

The present disclosure relates to fabricating and making interconnections of transducers and transducer arrays, particularly to fabricating and making interconnections of capacitive micromachined ultrasonic transducer (cMUT) arrays.

Making interconnections of a transducer array on a proper substrate is a key for any application using a transducer array, especially for a transducer array with large number of elements. One such example is ultrasound imaging which uses an ultrasound transducer arrays. The proper packaging and interconnections of the ultrasound transducer array is very important to achieve desired performance with lower cost.

Capacitive micromachined ultrasonic transducers (cMUTs) are electrostatic actuators/transducers, which are widely used in various applications. Ultrasonic transducers can operate in a variety of media including liquids, solids and gas. Ultrasonic transducers are commonly used for medical imaging for diagnostics and therapy, biochemical imaging, non-destructive evaluation of materials, sonar, communication, proximity sensors, gas flow measurements, in-situ process monitoring, acoustic microscopy, underwater sensing and imaging, and numerous other practical applications. A typical structure of a cMUT is a parallel plate capacitor with a rigid bottom electrode and a movable top electrode residing on or within a flexible membrane, which is used to transmit/accurate (TX) or receive/detect (RX) an acoustic wave in an adjacent medium. A direct current (DC) bias voltage may be applied between the electrodes to deflect the membrane to an optimum position for cMUT operation, usually with the goal of maximizing sensitivity and bandwidth. During transmission an alternating current (AC) signal is applied to the transducer. The alternating electrostatic force between the top electrode and the bottom electrode actuates the membrane in order to deliver acoustic energy into the medium surrounding the cMUT. During reception an impinging acoustic wave causes the membrane to vibrate, thus altering the capacitance between the two electrodes.

The top electrode is typically the movable electrode of the cMUT used to transmit and detect the acoustic wave. The movable electrode interfaces with the medium and usually is on the top of the substrate surface, thus called the top electrode. The bottom electrode is typically at least partially fixed (static) and usually locates underneath the top electrode in the substrate. In most cMUT applications, a cMUT array having multiple cMUT elements is used to perform a desired function. Usually each cMUT element in the array is addressed (connected to a signal line) from one of its two electrodes and another electrode is connected to a common electrode shared by multiple cMUT elements or all cMUT elements in the array. Currently, most cMUT arrays, especially 1-D arrays, have common fixed bottom electrodes. Each element in the array is individually addressed from its moving top electrode. The reason for using the top moving electrode as the individually addressed electrode is simply the ease of fabrication.

However, since the moving top electrode is used to interface the medium, there are some limitations to the methods of making electrode connections to the top electrode. For performance, packaging and electrical connection consideration, it is often desired to make the fixed bottom electrodes of a cMUT array the hot electrode (i.e., the individually addressed electrode), and make the top electrode the common electrode.

There are a few methods of processing, packaging and making interconnections known to make the bottom fixed electrodes as the individually addressed electrodes. One typical method is to drill holes on the substrate using various methods, and subsequently fill the holes using a conductive material. The process is relatively complex and has performance limitations. Also there is a trade-off between the parasitic capacitance and the conductivity of the interconnection in this method. This trade-off affects the device performance. Moreover, this method usually cannot make a flexible cMUT array.

Another method is to cut through the substrate underneath the elements to form individual bottom electrodes. The cut-through can be done with etching the substrate material. However, since the substrate underneath each element in the array is completely separated from its neighbor elements or the rest of the substrate, these methods require techniques to support or hold the elements in the array together during the cutting through of the substrate. One typical technique is to bond the cMUT with its fabrication substrate to another substrate, which provides support or holds the transducer elements in the array to continue the fabrication process, making interconnections and packaging. Another technique is to hold the transducer elements using a filler material between elements during the process. The material is usually an insulation material and can be a dialectical material or combination of multiple materials.

The existing methods are mainly developed for making interconnections of a 2-D array. These methods are relatively complex and may not be cost-efficient for 1-D array device. A better interconnection method for a cMUT array, especially for a 1-D cMUT array, is desired.

SUMMARY

Disclosed is a method for fabricating and making interconnections of electrostatic transducers and transducer arrays. The method electrically separates the substrate potions of the transducer elements from each other using a technique involving two cutting steps. The first cutting step forms a patterned opening in the substrate to make a partial separation of the transducer elements. After the first cutting step, the transducer array is secured to prevent instability of the transducer elements upon completion of the second cutting step. The second cutting step is then made to complete the separation. When the substrate is conductive, the separated substrate segments of the transducer elements serve as separate bottom electrodes that can be individually addressed. The method is especially useful for fabricating 1D transducer arrays.

One aspect of the disclosure is a method for fabricating a transducer including at least one transducer element on a substrate. The method forms a first patterned opening in the substrate. The first patterned opening defines a partial boundary of the substrate segment corresponding to the transducer element so that the transducer element remains partially connected to rest of the substrate by a connecting part in the substrate. The transducer is then secured so that the transducer element would remain stable with the substrate even if the connecting part in the substrate is removed. The method subsequently removes the connecting part in the substrate so that the transducer element no longer directly contact to the rest of the substrate. With a conductive substrate, the transducer element has a substrate segment serving as an individually accessible bottom electrode after removing the connecting part in the substrate. The method may also be used to completely separate the transducer array from the rest of the substrate so that the transducer array can be removed from the rest of the substrate. The method can be used for fabricating an electrostatic transducer array having multiple transducer elements with separated bottom electrodes, and is especially suitable for making 1-D transducer array. The method may also be used to form a through-wafer interconnection to access a front side electrode from the backside.

In one embodiment, the connecting part is a mechanically weak connection, and is removed by simply breaking the mechanically weak connection. In other embodiments, the connecting parts are removed by forming a second patterned opening in the substrate. The first patterned opening and the second patterned opening are designed to together complementarily define complete boundaries of the transducer element to separate the transducer elements in the substrate. Both the first patterned opening and the second patterned opening may be formed from the backside of the substrate. A preliminary patterned opening may be first formed from one side of the substrate to reach a depth in the substrate, and the first patterned opening and the second patterned opening may be formed from the other side to meet the preliminary patterned opening to complete the separation of the transducer elements.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

BRIEF DESCRIPTION OF THE FIGURES

The detailed description is described with reference to the accompanying figures. In the figures, the left-most digit(s) of a reference number identifies the figure in which the reference number first appears. The use of the same reference numbers in different figures indicates similar or identical items.

FIG. 1 illustrates a first exemplary embodiment of the disclosed method.

FIGS. 2-4 illustrate bottom views of several exemplary configurations of the patterned openings which can be implemented in the disclosed method.

FIG. 5 illustrates a second exemplary embodiment of the disclosed method.

FIG. 6 illustrates a third exemplary embodiment of the disclosed method.

FIG. 7 illustrates a fourth exemplary embodiment of the disclosed method.

FIGS. 8-10 illustrate cross-sectional views of several exemplary cMUTs fabricated in the method of FIG. 6 or FIG. 7.

FIG. 11A and FIG. 11B illustrate a bottom view and a cross-sectional view of an exemplary cMUT transducer array having a through-we for interconnection to access a top electrode from the bottom.

DETAILED DESCRIPTION

Disclosed are methods of packaging and making interconnections for electrostatic transducer arrays, especially cMUT arrays. The disclosed methods are particularly suitable for packaging 1D transducer arrays, but can be used in other type of transducer arrays as well.

In this description, a dielectric material is a non-conducting substance, i.e. an insulator. Examples of a dielectric material that are suitable for the present disclosure include, but not limited to, PDMS, Parylene, nitride film, oxide film, Riston, Kapton, photoresist, other polymer, and polyimide.

A substrate used to fabricate the transducer (e.g., a cMUT array) using MEMS or semiconductor fabrication process is refers to as the fabrication substrate. The fabrication substrate usually is a silicon wafer or a glass wafer.

A substrate which is used to package or assemble the transducers with desired metal patterns or other electrical components is referred to as a packaging substrate.

The terms such as "etch" and "cut" in the present disclosure refers to any suitable method for removing a material to form a desired pattern. A "pattern" or "patterned opening" in the present disclosure can be trenches, large openings in the material, or overall thinning of an entire layer or wafer. The methods of "etching" or "cutting" may include but not limited to dry etching, wet etching, dicing, grind/polish, milling, and mechanical breaking. A "filling material" or "filler material" in present disclosure may be a material added from outside or formed locally (e.g., by thermal oxidation).

In principle, the methods disclosed herein may be applied on any transducer or sensor array that has multiple transducer elements built on a substrate. The methods are particularly suitable for cMUT arrays. Any cMUT designs, including both flexible membrane cMUTs and embedded spring cMUTs (EScMUTs), may be used. A cMUT has a first electrode and a second electrode separated from each other by an electrode gap so that a capacitance exists between the electrodes. A spring member (e.g., a flexible membrane or a spring layer) supports one of the electrodes to enable the two electrodes to move toward or away from each other. In a flexible membrane cMUTs, the spring member is a flexible membrane directly supporting one of the electrodes. In an EScMUT, the spring member is a spring layer supporting an electrode on a plate which is suspended from the spring layer by spring-plate connectors.

In the disclosure, the flexible membrane cMUT design is used to illustrate the disclosed methods, but the same methods can be used for EScMUT, or any other transducers and sensors.

FIG. 1 illustrates a first exemplary embodiment of the disclosed method. Several major steps of the method are illustrated in multiple sequential views. Unless otherwise specified, figures in the present description are cross-section views. In this description, the order in which a process is described is not intended to be construed as a limitation, and any number of the described process blocks may be combined in any order to implement the method, or an alternate method.

At step one shown in FIG. 1.1, a transducer 101 is fabricated on a substrate 110. The structural details of the transducer layer 120 are not shown as they are not essential to the disclosed fabrication method. The transducer 101 may be a transducer array having multiple transducer elements. FIG. 1, however, uses a single transducer element 101-1 to illustrate a basic concept of the method.

At step two shown in FIG. 1.2 and FIG. 1.2B, a first patterned opening 170 is formed in the substrate 110. The illustrated first opening patterned 170 is an opening extending from the bottom side (backside) of the substrate 110 to the top side where the transducer layer 120 is formed. FIG. 1.2B illustrates a view of the shape or contour of the first patterned opening 170 from the bottom side of the substrate 110. As shown in FIG. 1.2B, the first opening 170 defines a partial boundary of a substrate segment 110-1 corresponding to the transducer element 101-1. The transducer element 101-1 is built on top of the substrate segment 110-1 and includes the substrate segment 110-1. The substrate segment 110-1 remains partially connected to rest of the substrate 110 by the connecting part (generally denoted as area 111) of the boundary of the substrate segment 110-1.

The first opening 170 can be formed using any suitable method. If the substrate 110 is a semiconductor type wafer, such as silicon wafer, a preferred method of forming the first opening 170 is etching. The etching may be done with one etch step or multiple etch steps from either the front side or the back side of the substrate, or from both sides. The shape and the profile of the first opening 170 can be of any form and may or may not be uniform, as long as the first opening 170 partially separates the substrate segment 110-1 corresponding to the transducer element 101-1 from the rest of substrate 110. The formation of the first opening 170 may be integrated with the cMUT fabrication and performed in step one (FIG. 1.1).

At step three shown in FIG. 1.3, a proper filler material 171 is filled in the first opening 170 to secure the transducer element 101-1 and its corresponding substrate segment 110-1 such that the substrate segment 110-1 would stably stay together with the rest of the substrate 110 even if the connecting part 111 in the substrate 110 is removed in a next step. As will be shown herein, other methods may be used to secure the transducer element 101-1 and its corresponding substrate segment 110-1. One example is to attach the transducer 101 including its substrate 110 to another substrate at this step.

At step four shown in FIG. 1.4 and FIG. 1.4B, a second patterned opening 175 is formed to remove the connecting part 110 in the substrate 110 so that the transducer element 101-1 no longer directly contacts to the rest of the substrate 110. Because the transducer element 101-1 and its substrate segment 110-1 are pre-secured using the filler material 171, these components remain stable when the second patterned opening 175 is formed.

In the illustrated embodiment, the second patterned opening 175 is an opening that has a depth comparable to the first opening patterned 170. As shown in the backside view in FIG. 1.4B at this step, the first opening 170 and the second opening 175 together define a complete boundary of the substrate segment 110-1 of the corresponding transducer element 101-1. In this description, the term "complete boundary" refers to a boundary that completely encircles a substrate segment in a lateral (longitudinal) dimension of a substrate and also extending a certain depth in a vertical (latitudinal) dimension of the substrate, but does not necessarily include any inherent, existing or premade boundaries of the substrate segment. Examples of such inherent, existing or premade boundaries are the top surface and the bottom surface of the substrate, and a premade boundary defined by a preliminary opening formed from a top side of the substrate, as shown herein.

After the second patterned opening 175 is formed, the substrate element 110-1 no longer directly contacts the rest of the substrate 110. The only contact between the substrate element 110-1 and the rest of the substrate 110 and this stage are indirect contacts such as the filler material 171 and the materials or parts of the transducer layer 120. In a typical wafer-based micromachined transducer, substrate 110 is conductive, and the transducer layer 120 is mostly electrically insulated from the conductive substrate 110 except for a bottom electrode (not shown) which may be contained in the transducer layer 120. In case where the transducer layer 120 contains a bottom electrode in addition to the underneath conductive substrate segment 110-1, the bottom electrode is electrically insulated from the rest of the transducer layer 120 and may be considered a part of the conductive substrate 110-1. In this embodiment, if the filler material is dielectric, the substrate segment 110-1 is electrically insulated from the rest of the substrate 110 and the substrate segments corresponding to other transducer elements in the same transducer 101. The electrically insulated conductive substrate segment 110-1 can thus serve as a separate bottom electrode of the transducer element 101-1.

Like the first patterned opening 170, the second patterned opening 175 may be made in any suitable method and in any shape. The second opening 175 may be a trench in the substrate 110 etched from the backside. The second opening 175 can be formed with one etch step or multiple etch steps from either the front side or the back side of the substrate, or from both sides. Therefore, the profile of the opening 170 may or may not be uniform. Moreover, the formation of at least a part of the second opening 175 may be integrated with the cMUT fabrication process and done in step one (FIG. 1.1).

At step five shown in FIG. 1.5, the second etched opening 175 is optionally filled with a desired material 176.

A straightforward use of the above method of separating substrate segments of individual transducer elements is to make interconnections of a transducer arrays. The separated substrate segments (110-1) serve as separate bottom electrodes of the transducer elements and can be accessed directly from the bottom side of the transducer array. As will be shown further herein, the same method may also be used to make through-wafer interconnections to assess the top electrodes of the transducer array.

The transducer layer 120 of the transducer array 101 may be fabricated before (as illustrated in FIG.1) or after the fabrication of the interconnection. Moreover, the fabrication of transducer layer 120 may also be integrated with the fabrication of the interconnection.

FIGS. 2-4 illustrate bottom side views of several exemplary configurations of the patterned openings which can be implemented in the disclosed method. FIG. 2A, FIG. 3A and FIG. 4A are exemplary first patterned openings 270, 370 and 470 in the substrate 210, 310 and 410, respectively. FIG. 2B, FIG. 3B and FIG. 4B are the exemplary configurations of the corresponding second patterned openings 275, 375 and 475 in the substrate. In each example, the first patterned opening (270, 370 and 470) and the second patterned opening (275, 375 and 475) together define the boundary of a prospective substrate segment (210-1, 310-1 and 410-1) corresponding to a transducer element.

Particularly, the first pattern 470 in FIG. 4A defines a nearly complete boundary of the substrate segment 410-1 and leaves only a mechanically weak portion 470a to connect the substrate segment 410-1 with the rest of substrate 410. In this implementation, the removing of the connecting part does not require forming of a substantial second patterned opening. Instead, as shown in FIG. 4B, it may be done by simply breaking the weak portion 470a formed in FIG. 4A so that the substrate segment 410-1 can be separated from the rest of substrate 410 without using any regular etching or cut method.

The method is further illustrated below in the context of cMUT arrays.

FIG. 5 illustrates a second exemplary embodiment of the disclosed method. The method is used in making a 2-D cMUT array 501 which has multiple cMUT elements such as 501-0, 501-1, 501-2, 501-3 and 501-4. The exemplary method is used for making separate bottom electrodes of the cMUT elements for interconnection.

At step one (shown in FIGS. 5.1, 5.1A and 5.1B), the cMUT array 501 is fabricated on the substrate 510. The cMUT element 501-0 is surrounded by neighboring cMUT elements 501-1, 501-2, 501-3 and 501-4. FIG. 5.1 shows the top view, while FIG. 5.1A and FIG. 5.1B show the cross-sectional view in AA' direction and the cross-sectional view in BB' direction, respectively, at this step. The cross sectional views in AA' and BB' directions look similar in this step. The cMUT array 501 includes the substrate 510 which is to form bottom electrode/substrate segments of the cMUT elements, top electrode 520, flexible membrane 530, membrane anchor 540, and cavity/transducing space 560. A preliminary etching pattern 573 (e.g., trenches) is optionally formed from the topside of the substrate 510 during the cMUT fabrication. The preliminary etching pattern 573 may be formed directly on the prime wafer of the substrate 510 before the cMUT structures are fabricated, so that the preliminary etching pattern 573 are embedded under the top electrode 520 and in the top portion of the substrate 510. In the illustrated embodiment, the preliminary etching pattern 573 has two groups of parallel trenches extending along two perpendicular lateral directions across the surface of the substrate 510 to form a grid. The crisscrossed areas of the grid define boundaries of each transducer element from the top side of the substrate 510. The preliminary etching pattern 573 may be filled with a desired material if needed.

At step 2 (shown in FIG. 5.2), a first etching pattern 570 (e.g., trenches) is formed from backside to reach the bottom of the preliminary etching pattern 573. The substrate 510 may be thinned down before the etching. The first pattern 570 should be etched through the substrate 510 if no preliminary etching pattern 573 has been formed at step one. The first etching pattern 570 may be filled with any suitable material. The filler material can be an added-in material (e.g., LTO, nitride, PDMS, polyimide, photoresistor, polymer, etc.) or formed locally (e.g., using thermal oxidation).

FIG. 5.2 shows the bottom of the cMUT array 501, while FIG. 5.2A and FIG. 5.2B show the cross-sectional views in AA' and BB' directions, respectively, at this stage. The first etching pattern 570 shown is only an example. The first etching pattern 570 defines a partial boundary of each substrate segment (510-0, 510-1, 510-2, 510-3 and 510-4) corresponding to each transducer element (501-1, 501-2, 501-3 and 501-4), so that substrate segments (510-0, 510-1, 510-2, 510-3 and 510-4) remain partially connected to the substrate 510 by certain connecting parts 511 remaining in the substrate 510.

In the illustrated embodiment of FIG. 5, the first etching pattern 570 includes trenches (570) extending along a first lateral direction on the bottom surface of the substrate 510. The trenches (570) are formed between neighboring cMUT elements and extend into the substrate (into the paper in FIG. 5.2) to meet the corresponding bottoms of one of the two groups of the parallel trenches in the preliminary etching pattern 573 extending along the same lateral direction. Because the preliminary etching pattern 573 have two groups of parallel trenches, the areas (511) underneath the second group of the parallel trenches of the preliminary etching pattern 573 extending along the other lateral direction serve as connecting parts to still connect the substrate segments (510-0, 510-1, 510-2, 510-3 and 510-4) to the substrate 510.

In other words, the first etching pattern 570 leaves some un-etched areas (511) along the boundaries of the cMUT elements. The un-etched areas 511 hold the cMUT array 501 during the fabrication process at step two. The un-etched area 511 may also serve to hold the cMUT array 501 if the cMUT array 501 needs to be integrated with another substrate.

At step 3 (shown in FIG. 5.3), a second etching pattern 575 (e.g., trenches) is formed from backside to reach the bottom of the other group of parallel trenches in the preliminary etching pattern 573. The substrate 510 may be thinned down before the etching. FIG. 5.3 shows a bottom view, while FIG. 5.3A and FIG. 5.3B show cross-sectional views in AA' and BB' direction, respectively, at this step.

The second etching pattern 575 should be etched through the substrate if no optional preliminary etching pattern 573 has been formed at step one. The etching aims to remove the un-etched areas or the connecting areas 511 at the boundary of the cMUT element left at step two. The second etching pattern 575 and the first etching pattern 570 together complementarily define the boundary of the substrate segments (510-0, 510-1, 510-2, 510-3 and 510-4) of the cMUT elements (501-1, 501-2, 501-3 and 501-4). The illustrated exemplary second etching pattern 575 includes a group of parallel trenches extending along the lateral direction perpendicular to the trenches in the first etching patterned 570 to form a grid corresponding to the grid formed by the preliminary etching pattern 573. The crisscrossed areas of the grid define boundaries of the transducer elements from the bottom side of the substrate 510.

Optionally, the fabricated cMUT array 501 may be bonded with a substrate (e.g., PCB, IC chip, etc.) with a desired connection pattern as will be shown herein.

It is noted that although the illustrated examples show parallel trenches of the etching patterns, any shape can be used as long as the first etching pattern defines only partial boundaries of the transducer elements and the second etching pattern is complementary to the first etching pattern to complete the boundaries of the transducer elements. For example, any exemplary shapes and configurations of the first etching pattern and the complementary second etching pattern shown in FIGS. 2, 3 and 4 may be used.

The disclosed method is particularly useful to separate the substrate into segments as the bottom electrodes in a 1-D transducer array. Two exemplary embodiments of making separated substrate segments to be the bottom electrodes in a 1-D transducer array are illustrated below with reference to FIG. 6 and FIG. 7.

FIG. 6 illustrates a third exemplary embodiment of the disclosed method. FIG. 6 shows bottom views of a 1-D transducer array 601 fabricated on substrate 610 in various steps of forming separate substrate segments for individual transducer elements. The 1-D transducer array 601 has multiple transducer elements arranged side by side along the lateral direction indicated by X-axis.

The first step (shown in FIG. 6.1) makes a first cutting pattern 670. The first cutting pattern 670 includes trenches (670) along a lateral direction indicated by Y-axis. The trenches (670) are located between the transducer elements corresponding to the substrate segments (e.g., 610-0, 610-1 and 610-2) being formed. The first cutting pattern 670 defines the width or pitch of the separated substrate segments (e.g., 610-0, 610-1 and 610-2) of the 1-D transducer array 601 and partially separates the substrate segments of the corresponding transducer elements.

The second step (shown in FIG. 6.2) fills the first pattern 670 with a proper material 671. The material 671 can be filled in or formed locally (e.g., by oxidation). This filling step may be optional if the array is attached to a supporting object (e.g., PCB, IC chip, or any other substrate).

The third step (shown in FIG. 6.3) makes a second cutting pattern 675. FIG. 6.3 shows a bottom view of the substrate 610 with the first cutting pattern 670 and the second cutting pattern 675 at this step. The illustrated embodiment of the second cutting pattern 675 includes two trenches extending along a lateral direction indicated by X-axis substantially perpendicular to the trenches in the first cutting pattern 670. The first trench in the second cutting pattern 675 is formed at a first common side (the top side in FIG. 6.3) of the substrate segments (e.g., 610-0, 610-1 and 610-2) of the transducer elements, and the second trench in the second cutting pattern 675 is formed at a second common side (the bottom side in FIG. 6.3) of the substrate segments (e.g., 610-0, 610-1 and 610-2) of the transducer elements. The second cutting pattern 675 and the first cutting pattern 670 combine together to complementarily define the boundaries of the separated substrate segments, such as 610-0, 610-1 and 610-2. The second cutting pattern 675 may be optional filled using a proper material if needed.

The shape and dimension of the first cutting pattern 670 are partially constrained by both the element dimension and the pitch of the transducer array 601. Since the trenches of the second cutting pattern 675 are located at the edges of the transducer array 601, there is much more freedom to choose the shape and dimension of the cutting pattern 675, as well as the cutting method to form the cutting pattern 675. For example, the second cutting pattern 675 can be simply formed by dicing either before or after the transducer array is packaged.

Moreover, the second cutting pattern 675 shown in FIG. 6.3 can be simply done by manually breaking the transducer array 601 from the substrate 610 before or after the array packaged. The first cutting pattern 670 may need to be specially designed to facilitate this procedure. An exemplary first cutting pattern 670a suitable for this purpose is shown in FIG. 6.1A. The first pattern 670a has cuttings (e.g., trenches) both between the substrate segments for the transducer elements and along the common sides of the substrate segments. With the exemplary 1-D transducer array 601, the common sides of the substrate segments are the edge of the transducer array 601. Unlike the first pattern 670, the first pattern 670a defines nearly complete boundaries of the substrate segments except for leaving certain areas uncut to form mechanically weak connecting parts or structures 611a (e.g., tether structures). The mechanically weak connecting parts or structures 670a are designed to be strong enough to temporarily hold the transducer array 601 during the fabrication process and packaging, yet weak enough to be broken without having to damage the transducer array 601 during manual separation of the transducer array 601 from the substrate 610.

FIG. 7 illustrates a fourth exemplary embodiment of the disclosed method. FIG. 7 shows bottom views of the transducer array 701 fabricated on substrate 710 in various steps of forming separate substrate segments for individual transducer elements.

The first cutting step (shown in FIG. 7.1) makes a first cutting pattern 775 to partially separate the substrate segments of the transducer elements. The first cutting pattern 775 includes trenches (775) extending along the lateral direction indicated by X-axis. The illustrated embodiment of the second cutting pattern 675 includes two trenches. The first trench in the first cutting pattern 775 is formed at a first common side (the top side in FIG. 7.1) of the substrate segments of the transducer elements, and the second trench in the first cutting pattern 775 is formed at a second common side (the bottom side in FIG. 7.1) of the substrate segments of the transducer elements. The first cutting pattern 775 defines the length of the separated substrate segments (e.g., 710-0, 710-1 and 710-2) of the 1-D transducer array 701. The first cutting pattern 775 is optionally filled with a suitable filler material 776. The material 776 can be filled in or formed locally (e.g., by oxidation). Since the trenches of the first cutting pattern 775 are located at the edges of the transducer array 701, there is much more freedom to choose the shape and dimension of the first cutting pattern 775, as well as the cutting method to form the cutting pattern 775. For example, the first cutting pattern 775 can be simply formed by dicing either before or after the transducer array is packaged.

The second cutting step (shown in FIG. 7.2) makes a second cutting pattern 770. FIG. 7.2 shows the bottom view of the substrate 710 with the first cutting pattern 775 and the second cutting pattern 770 at this step. The trenches (770) are located between the transducer elements corresponding to the substrate segments (e.g., 710-0, 710-1 and 710-2). The second cutting pattern 770 defines the width of the separated substrate segments (e.g., 710-0, 710-1 and 710-2) of the 1-D transducer array 701. The second cutting pattern 770 and the first cutting pattern 775 combine together to complementarily define the boundaries of the separated substrate segments, such as 710-0, 710-1 and 710-2. The second cutting pattern 770 may be optional filled using a proper material if needed.

As shown in FIG. 7.2A, the second cutting step may have a trench pattern 770a to form a mechanically weak connecting parts or structures 711a (e.g., tether structures) at the desired locations to still connect a transducer array 701 to the rest of the substrate 710 but allow a simple manual breaking-off. The mechanically weak connecting parts or structures 711a are designed to be stronger enough to hold the array 701 during the fabrication process and packaging and weak enough to be broken during manual separation of the array 701 with the substrate 710.

The exemplary embodiments of the method in FIGS. 6-7 are further illustrated by showing structural details at the transducer element level with reference to FIGS. 8-9 below, which are cross-sectional views of various exemplary 1-D cMUT arrays made using the disclosed method.

FIGS. 8-10 illustrate cross-sectional views of several exemplary cMUTs fabricated in the method of FIG. 6 or FIG. 7. The cMUT 801 in FIG. 8 has a common top electrode 820 shared by all cMUT elements 801-0, 801-1 and 801-2 in the array. Each cMUT element has a common top electrode 820, separate bottom electrode/substrate segment (810-0, 810-1, or 810-2), flexible membrane 830, membrane anchors 840, cavity/transducing space 860, and first patterned opening 870 between cMUT elements 801-0, 801-1 and 801-2.

The cMUT 901 in FIG. 9 has both separated top electrodes and bottom electrodes for cMUT elements 901-0, 901-1, and 901-2 in the array. Each cMUT element has a separate top electrode (920-0, 920-1 and 920-2), a separate bottom electrode/substrate segment (910-0, 910-1 and 910-2), flexible membrane 930, membrane anchor 940, cavity/transducing space 960 and first patterned opening 970 between cMUT elements.

The cMUT 1001 in FIG. 10 is attached to or integrated with an additional substrate with desired electric connections. Each cMUT element (1001-0, 1001-1 and 1001-2) has a common top electrode 1020, separate bottom electrode/substrate segment (1010-0, 1010-1, or 1010-2), flexible membrane 1030, membrane anchors 1040, cavity/transducing space 1060, and first patterned opening 1070 between cMUT elements. The additional substrate 1080 may be a PCB, Flex, IC chip, or other substrates, and may have desired interconnection metal pattern 1085. As described herein, the additional substrate 1080 may serve as a support substrate to temporarily hold the transducer elements 1001-0, 1001-1 and 1001-2 and their corresponding substrate segments 1010-0, 1010-1 and 1010-2 before the remaining connections (such as mechanically weak connections) between the substrate segments 1010-0, 1010-1 and 1010-2 and the rest of the substrate 1010 are removed or broken.

In FIG. 10, the interconnections 1085 of the additional substrate 1080 are accessed from the bottom surface of the bottom substrate 1010 via the separate substrate segments (1010-0, 1010-1 or 1010-2). However, the interconnections of the additional substrate may also be accessed from a side of the transducer, such as the end of a 1-D transducer array.

The disclosed method may also be adapted to make through-wafer interconnections to access the top electrodes of a transducer array from the bottom or a side of the transducer array. Such access may be desirable with a cMUT array, especially for a 1-D array, that has fixed bottom electrodes as the individually addressed electrodes. An example of such an application is described below.

FIG. 11A and FIG. 11B illustrate a bottom view and a cross-sectional view of an exemplary cMUT transducer array having a through-wafer interconnection to access a top electrode from the bottom. The cMUT array 1101 is a 1-D array of multiple cMUT elements such as 1101-1 and 1101-2. Each cMUT element has the common top electrode 1120, a separate bottom electrode/substrate segment (e.g., 1110-1 or 1110-2), flexible membrane 1130, membrane anchors 1140, cavity/transducing space 1160, a first patterned opening (trench) 1170, and a second patterned opening (trench) 1175. In addition to the cMUT elements, the cMUT array 1101 further has an interconnection element 1101a added into the array to electrically connect with the top electrode 1120 so that the top common electrode 1120 can be accessed from the bottom of the array. The interconnection element 1101a shares the top common electrode 1120 which is also the top electrode of cMUT elements in the array, and includes a through-wafer conductor (insulated substrate segment) 1110a which is to electrically connect with the top electrode 1120 from the bottom. A similar design may also be used to access a top electrode of an individual cMUT element where the cMUT elements of the array have separate top electrode. In this implementation, the interconnection element 1101a is only used to assess the top electrode of a neighboring cMUT element (e.g., 1101-2).

The formation of the through-wafer conductor (insulated substrate segment) 1110a is similar to the formation of the separated substrate segments (bottom electrodes) of the cMUT elements as described herein. The first patterned opening 1170 defines a partial boundary of a substrate segment 1110a corresponding to the interconnection element 1101a so that the substrate segment 1110a remain partially connected to the substrate 1110 by a connecting part remaining in the substrate 1110. The second patterned opening 1175 removes the connecting part that connects the substrate segment 1110a to the rest of the substrate 1110. Upon removing the connecting part, the substrate segment 1110a no longer directly contacts the substrate 1110, and further no longer directly contacts the substrate segments (e.g. 1110-2 and 1110-1) of the cMUT elements. Because the substrate 1110 is conductive, the substrate segment 1110a service as an interconnection to the top electrode 1120 shared by the cMUT elements. This enables the top electrode of the cMUT elements to be accessed from a bottom side of the substrate. Since the interconnection element 1101a does not have any transducer function built-in, its size may not be the same as that of the cMUT elements. In addition, the interconnection element 1101a may be located anywhere along the boundary of the cMUT array 1101 and preferably near the cMUT element (e.g., 1110-0) accessed by the interconnection element 1101a.

The above-described interconnection approach can be very useful for cMUT arrays in IVUS and ICE applications because of the space limitation and the limitation to the total number of the interconnection pads that can be made in the transducer array. Examples of such uses are disclosed in International (PCT) Patent Application No. PCT/US 08/85447, entitled "CMUT PACKAGING FOR ULTRASOUND SYSTEM"; and International (PCT) Patent Application No. PCT/US 08/85352, entitled "PACKAGING AND CONNECTING ELECTROSTATIC TRANSDUCER ARRAYS"; both filed on even date with the present application.

It is appreciated that the potential benefits and advantages discussed herein are not to be construed as a limitation or restriction to the scope of the appended claims.

Although the subject matter has been described in language specific to structural features and/or methodological acts, it is to be understood that the subject matter defined in the appended claims is not necessarily limited to the specific features or acts described. Rather, the specific features and acts are disclosed as exemplary forms of implementing the claims.

What is claimed is:

1. A method comprising:
   forming a transducer including at least a transducer element on a substrate;
   forming a first patterned opening through the substrate, the first patterned opening defining a partial boundary of a substrate segment corresponding to the transducer element so that the substrate segment remains partially connected to rest of the substrate through a connecting part remaining in the substrate;
   securing the substrate segment so that the substrate segment would remain stable with the substrate even if the connecting part of the substrate is removed; and
   removing the connecting part of the substrate so that the substrate segment no longer directly contacts the rest of the substrate.

2. The method as recited in claim 1, wherein the substrate is conductive, and removing the connecting part in the substrate electrically separates the substrate segment from the rest of the substrate to form a bottom electrode of the transducer element to be individually addressed.

3. The method as recited in claim 1, wherein securing the substrate segment comprises adding or forming a filler material in the first patterned opening.

4. The method as recited in claim 1, wherein securing the substrate segment comprises attaching the transducer element to a support substrate.

5. The method as recited in claim 4, wherein the support substrate is a packaging substrate containing conductive connections to connect the transducer to outside.

6. The method as recited in claim 1, wherein removing the connecting part comprises forming a second patterned opening in the substrate, wherein the first patterned opening and the second patterned opening together define a complete boundary of the substrate segment to separate the substrate segment from the rest of the substrate.

7. The method as recited in claim 1, wherein:
the connecting part is a mechanically weak connection, and
removing the connecting part comprises breaking the mechanically weak connection.

8. The method as recited in claim 1, wherein the transducer is formed on the front side of the substrate, and the first patterned opening is formed from a backside of the substrate.

9. The method as recited in claim 1, further comprising forming a preliminary patterned opening from a first side of the substrate to reach a depth in the substrate, wherein the first patterned opening is formed from an opposing side of the substrate to meet the preliminary patterned opening.

10. The method as recited in claim 9, wherein:
removing the connecting part in the substrate comprises forming a second patterned opening in the substrate from the opposing side of the substrate to meet the preliminary patterned opening, and
the preliminary patterned opening, the first patterned opening and the second patterned opening together define a complete boundary of the substrate segment to separate the substrate segment from the rest of the substrate.

11. The method as recited in claim 9, wherein forming the preliminary patterned opening comprises forming the preliminary etching pattern directly on the first side of the substrate before the transducer is formed.

12. The method as recited in claim 1, wherein the electrostatic transducer is a capacitive micromachined ultrasonic transducer (cMUT).

13. A method comprising:
forming on a substrate, a transducer array including at least a first transducer element and a second transducer element;
forming a first patterned opening through the substrate, the first patterned opening defining partial boundaries of a first substrate segment corresponding to the first transducer element and a second substrate segment corresponding to the second transducer element, so that the first substrate segment and the second substrate segment remain partially connected to the substrate by a respective connecting part remaining in the substrate;
securing the first and the second substrate segments so that the first and the second substrate segments would stay stably with the substrate even if the connecting parts are removed; and
removing the connecting parts so that the first and the second substrate segments no longer directly contact the substrate and further no longer directly contact each other in the substrate.

14. The method as recited in claim 13, wherein:
the substrate is conductive, the first substrate segment serving as a bottom electrode of the first transducer element, and the second substrate segment serving as a bottom electrode of the second transducer element, and
removing the connecting parts in the substrate, electrically separates the bottom electrodes of the first and the second transducer elements from each other.

15. The method as recited in claim 13, wherein securing the first and second substrate segments comprises adding or forming a filler material in the first patterned opening.

16. The method as recited in claim 13, wherein securing the first and second substrate segments comprises attaching the transducer array to a support substrate.

17. The method as recited in claim 13, wherein:
removing the connecting parts comprises forming a second patterned opening in the substrate, and
the first patterned opening and the second patterned opening together define complete boundaries of the first substrate segment and the second substrate segment.

18. The method as recited in claim 13, wherein:
at least one of the connecting parts is a mechanically weak connection, and
removing the connecting parts comprises breaking the mechanically weak connection.

19. The method as recited in claim 13, wherein the transducer array is formed on the front side of the substrate, and the first patterned opening is formed from a backside of the substrate.

20. The method as recited in claim 13, wherein:
the first patterned opening comprises a trench along a first lateral direction between the first and the second transducer elements, and
removing the connecting parts comprises forming a second patterned opening in the substrate, the second patterned opening including a first opening on a first common side of the first and the second transducer elements and a second opening on an opposing second common side of the first and the second transducer elements, the second patterned opening extending along a second lateral direction substantially perpendicular to the first lateral direction.

21. The method as recited in claim 20, wherein:
the transducer array comprises a one-dimensional array arranged in the second lateral direction, and
the first common side of the first and second transducer elements is near an edge of the transducer array and the second common side of the first and the second transducer elements is near an opposing edge of the transducer array.

22. The method as recited in claim 13, wherein:
the first patterned opening comprises a first opening on a common side of the first and the second transducer elements and a second opening on an opposing common side of the first and the second transducer elements, the first opening and the second opening extending along a first lateral direction, and
removing the connecting parts comprises forming a second patterned opening including a trench between the first and the second transducer elements along a second lateral direction substantially perpendicular to the first lateral direction.

23. The method as recited in claim 13, wherein removing the connecting parts completely separates the first transducer element and the second transducer element from a remainder of the substrate so that the transducer array can be removed from the remainder of the substrate.

24. The method as recited in claim 13, further comprising forming a preliminary patterned opening from a first side of the substrate to reach a depth in the substrate, wherein the first patterned opening is formed from an opposing side of the substrate to meet the preliminary patterned opening.

25. The method as recited in claim 24, wherein:
removing the connecting parts in the substrate comprises forming a second patterned opening in the substrate from the opposing side of the substrate to meet the preliminary patterned opening, and the preliminary patterned opening, the first patterned opening and the second patterned opening together define complete boundaries of the first substrate segment and the second substrate segment.

26. The method as recited in claim 13, wherein:

the transducer array further comprises an interconnection element connecting to a top electrode of the second transducer element, the first patterned opening defines a partial boundary of a third substrate segment corresponding to the interconnection element so that the third substrate segment remains partially connected to the substrate by a respective connecting part remaining in the substrate, and after removing the respective connecting part, the third substrate segment no longer directly contacts the substrate, and further no longer directly contacts the second substrate segment.

27. The method as recited in claim 26, wherein:

the substrate is conductive, and after removing the respective connecting part in the substrate, the third substrate segment serves as an interconnection to the top electrode of the second transducer element, such that the top electrode of the second transducer element can be accessed from a bottom side of the substrate through the interconnection.

28. A method comprising:

forming on a substrate, a transducer array including a plurality of transducer elements each corresponding to a respective substrate segment;

forming a first patterned opening in the substrate from a side of the substrate, the first patterned opening defining partial boundaries of the substrate segment so that the substrate segments each remain partially connected to the substrate by a respective connecting part remaining in the substrate;

securing the substrate segments by adding or forming a filler material in the first patterned opening so that the substrate segments stably stay with the substrate if the connecting parts are removed; and forming a second patterned opening in the substrate from the same side of the substrate to remove the connecting parts, so that the substrate segments no longer directly contact the substrate and further no longer directly contact each other.

29. A method comprising:

forming on a substrate a 1-D transducer array of a plurality of transducer elements arranged side-by-side in a first lateral direction, each transducer element corresponding to a respective substrate segment;

forming a first patterned opening through the substrate from a side of the substrate, the first patterned opening defining partial boundaries of the substrate segments so that the substrate segments remain partially connected to the substrate by respective connecting parts remaining in the substrate;

securing the substrate segments so that the substrate segments of the transducer array stably stay together with the substrate if the connecting parts are removed; and forming a second patterned opening in the substrate from a same side of the substrate to remove the connecting parts, wherein one of the first patterned opening and the second patterned opening comprises a plurality of trenches each disposed between two neighboring transducer elements and extending along a second lateral direction substantially perpendicular to the first lateral direction, the other one of the first patterned opening and the second patterned opening includes a first opening on a common side of the plurality of transducer elements and a second opening on an opposing common side of the plurality of transducer elements, and the first patterned opening and the second patterned opening together separate the substrate segments so that the substrate segments no longer directly contact the substrate, and further no longer directly contact each other in the substrate.

* * * * *